(12) United States Patent
Fujikawa et al.

(10) Patent No.: US 6,551,449 B2
(45) Date of Patent: Apr. 22, 2003

(54) THIN ELECTRONIC CIRCUIT COMPONENT AND METHOD AND APPARATUS FOR PRODUCING THE SAME

(75) Inventors: Keiji Fujikawa, Hadano (JP); Yutaka Hashimoto, Atsugi (JP); Isamu Takaoka, Hadano (JP); Shinichi Kazui, Hadano (JP); Hideaki Sasaki, Hadano (JP); Hitoshi Odashima, Yokohama (JP); Mitsugu Shirai, Hadano (JP)

(73) Assignee: Hitachi, Ltd., Tokyo (JP)

( * ) Notice: Subject to any disclaimer, the term of this patent is extended or adjusted under 35 U.S.C. 154(b) by 171 days.

(21) Appl. No.: 09/753,671

(22) Filed: Jan. 4, 2001

(65) Prior Publication Data

US 2001/0050138 A1 Dec. 13, 2001

Related U.S. Application Data

(62) Division of application No. 09/197,464, filed on Nov. 23, 1998, now Pat. No. 6,203,655.

(30) Foreign Application Priority Data

Nov. 26, 1997 (JP) .............................................. 9-324174

(51) Int. Cl.⁷ ............................................... B32B 31/20
(52) U.S. Cl. .................... 156/380.9; 156/384; 156/499; 118/642
(58) Field of Search ........................... 156/272.8, 379.6, 156/380.9, 384, 387, 499; 118/641, 642; 427/372.2, 555

(56) References Cited

U.S. PATENT DOCUMENTS 4,931,323 A 6/1990 Manitt et al.
5,055,968 A 10/1991 Nishi et al.
5,783,867 A 7/1998 Belke, Jr. et al.
5,952,713 A 9/1999 Takahira et al.
2002/0036895 A1 * 3/2002 Odashima et al. .......... 361/737

FOREIGN PATENT DOCUMENTS

| DE | 4416697 A1 | 11/1995 | |
|----|------------|---------|---|
| DE | 19504194 | 4/1996 | |
| DE | 19511300 | 10/1996 | |
| EP | 350235 A2 | 1/1990 | |
| EP | 710060 A1 | 5/1996 | |
| EP | 803839 A1 | 10/1997 | |
| JP | 63-202191 | 8/1988 | |
| JP | 2-110994 | 4/1990 | |
| JP | 3-262187 | 11/1991 | |
| JP | 9-216485 | 8/1997 | |
| JP | 9-1970 | 10/1997 | |
| JP | 11289149 A | * 10/1999 | ............ H05K/3/12 |

* cited by examiner

Primary Examiner—Michael W. Ball
Assistant Examiner—John T. Haran
(74) Attorney, Agent, or Firm—Mattingly, Stanger & Malur, P.C.

(57) ABSTRACT

Electric conductor patterns including antenna coils are formed on one surface of a film. Electronic components are fixed onto the film by a temporary fixing material. A cover film is laminated on the film so that the electrically conductive patterns and the electronic components are covered with the cover film. Simultaneously with the lamination, the electronic components are connected to the electric conductor patterns.

5 Claims, 9 Drawing Sheets

THIN ELECTRONIC CIRCUIT COMPONENT AND METHOD AND APPARATUS FOR PRODUCING THE SAME

This is a divisional application of U.S. Ser. No. 09/197, 464, filed Nov. 23, 1998, now U.S. Pat. No. 6,203,655.

BACKGROUND OF THE INVENTION

The present invention relates to thin electronic circuit components and particularly to a film-like thin electronic circuit component adapted to a non-contact system.

For example, IC cards, film computers, electronic paper, etc. are known as thin electronic circuit components. For example, the thickness of such a thin electronic circuit component is reduced to be in a range of from 0.25 to 0.76 mm.

Generally, most of IC cards used at present are of a contact type. That is, a connection terminal for electrically connecting an IC card to a reader/writer is exposed on a surface of the IC card so that the reader/writer performs an operation of reading/writing data from/into an IC chip contained in the IC card through the connection terminal.

As opposed to such contact type IC cards, thin electronic circuit components such as non-contact type IC cards have been researched and developed in recent years. In each of the non-contact type IC cards, an antenna coil is buried in the IC card so that the reader/writer reads/writes data from/into an IC chip contained in the IC card through the antenna coil by radio. With respect to such non-contact type IC cards, also the present applicant has developed trial and discussion.

Through the trial and discussion about such IC cards and a method for producing the same, the present applicant has found that there are problems as follows. That is, with respect to an IC card per se, there is a problem that the IC card is a structure which needs a large number of producing steps. With respect to the method for producing an IC card, there is a problem that the production line is long and the area of the production floor is large.

Incidentally, such problems may arise not only in IC cards but also in thin electronic circuit components such as film computers, electronic paper, etc.

SUMMARY OF THE INVENTION

A first object of the present invention is to provide an electronic circuit component which requires a small number of producing steps.

A second object of the present invention is to provide a method and apparatus for producing thin electronic circuit components in which the length of the production line can be reduced so that the area of the production floor can be narrowed.

(1) In order to achieve the first object, the present invention provides an electronic circuit component which comprises a film, an electric conductor pattern formed on one surface of the film and including an antenna coil, an electronic component electrically connected to the electric conductor pattern and fixed to the film by a fixing liquid, and a cover film which is laminated on the film so that the electric conductor pattern and the electronic component are covered with the cover film.

By the aforementioned configuration, the electronic circuit component is provided as a single layer structure in which the electric conductor pattern is formed only on one surface of the film. Accordingly, the thickness of the electronic circuit component can be reduced.

(2) In order to achieve the aforementioned second object, the present invention provides a method comprising: a drying step in which paste printed on a surface of a film is dried to thereby form an electric conductor pattern; a component mounting step in which an electronic component is mounted on the electric conductor pattern formed on the surface of the film and the electronic component is fixed onto the electric conductor pattern by a temporary fixing material; and a laminating step in which the electronic component is connected to the electric conductor pattern and a cover film is laminated on the film.

According to the aforementioned method, the electric conductor pattern is formed only on one surface of the film, so that the drying step can be reduced and the production line can be shortened.

(3) Preferably, in the above paragraph (2), the drying step includes radiating a light beam onto the paste to thereby dry or thermally harden the paste.

By the aforementioned method, the total length of a drier can be reduced, so that the production line can be extremely shortened.

(4) Preferably, in the above paragraph (3), the light beam is generated to have a wavelength which is high in absorption factor with respect to the paste and high in transmission factor with respect to the film.

According to the aforementioned method, the shrinkage of the film caused by heat can be suppressed. Therefore, an annealing step provided as a preparatory step can be eliminated, so that the production line can be shortened.

(5) In order to achieve the aforementioned second object, the present invention provides a method comprising: a component-mounting step in which an electronic component is mounted on an electric conductor pattern formed on one surface of a film and the electronic component is fixed to the electric conductor pattern by a temporary fixing material; and a laminating step in which the electronic component is connected to the electric conductor pattern and a cover film is laminated on the film, wherein in the laminating step, the cover film which is coated with paste is heated/pressed so that the cover film is laminated on the film and, at the same time, connection terminals of the electronic component fixed onto the electric conductor pattern are connected to the electric conductor pattern.

By the aforementioned method, lamination and component connection are performed simultaneously in one step, so that the production line can be shortened.

(6) In order to achieve the aforementioned second object, the present invention provides an apparatus comprising: a printing/coating means for printing or applying a temporary fixing material on a component mount position of a film having an electric conductor pattern formed on its one surface; a component mounting means for mounting an electronic component on the electric conductor pattern formed on the one surface of the film; and a simultaneous lamination/component-connection means for connecting the electronic component to the electric conductor pattern and laminating a cover film on the film at the same time.

DESCRIPTION OF THE PREFERRED EMBODIMENTS

An IC card which is a thin electronic circuit component according to an embodiment of the present invention will be described below with reference to FIGS. 1 through 16.

Figure 1:
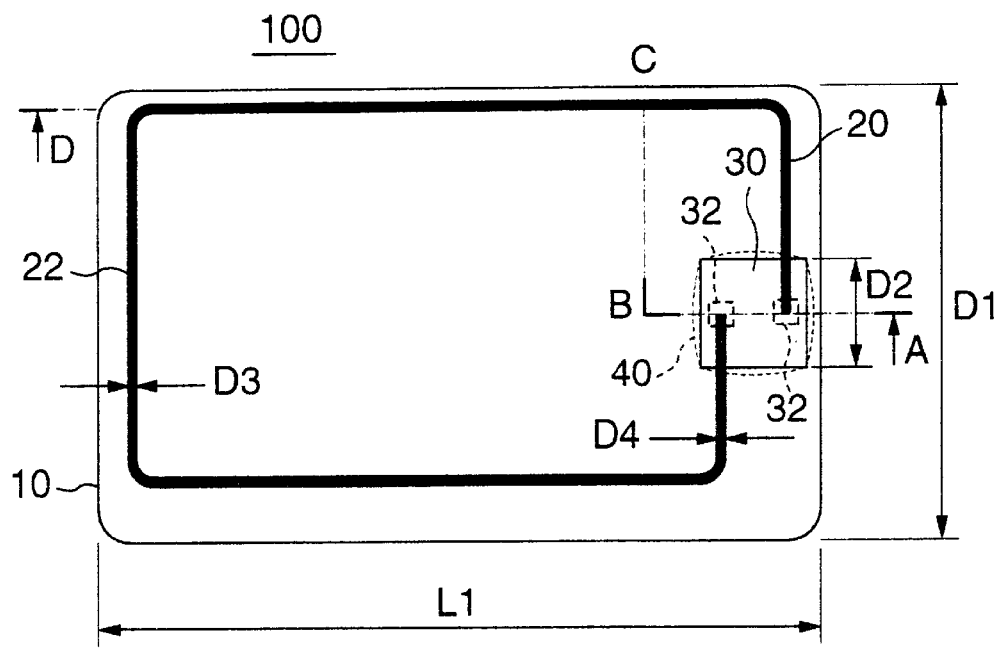
FIG. 1 is a plan view of an IC card which is a thin electronic circuit component according to an embodiment of the present invention.
Figure 2:
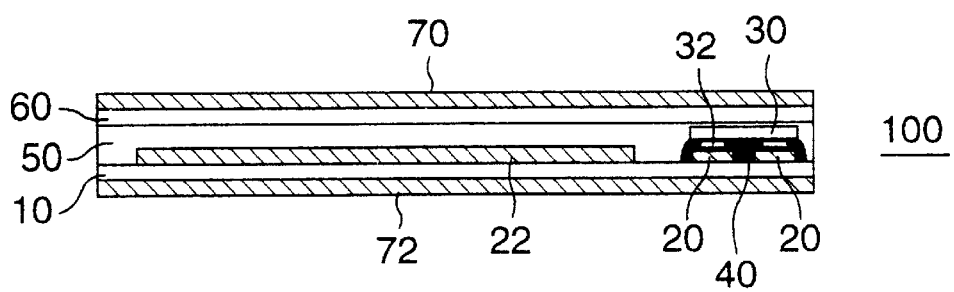
FIG. 2 is a sectional view taken along the line A-B-C-D in FIG. 1, showing a section of the IC card which is a thin electronic circuit component according to the embodiment of the present invention.
Figure 3:
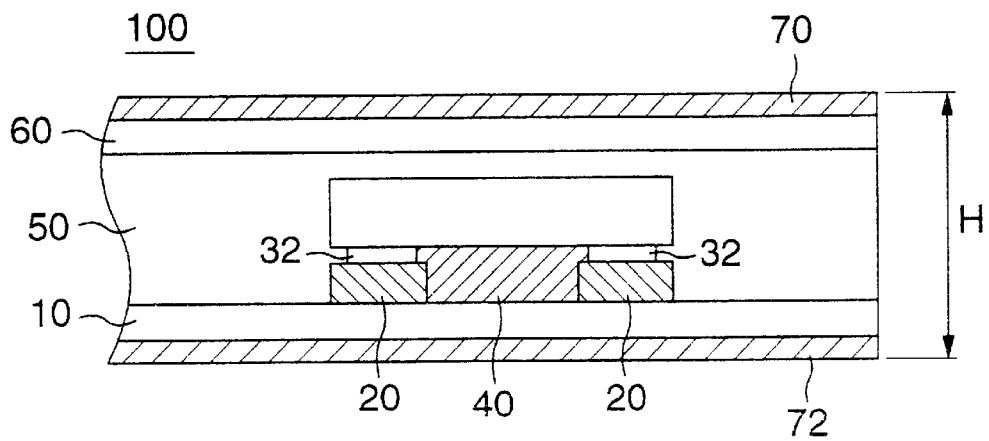
FIG. 3 is an enlarged sectional view of a main part in FIG. 2, showing a section of the IC card which is a thin electronic circuit component according to the embodiment of the present invention.

First, referring to FIGS. 1 through 3, the configuration of an IC card in this embodiment will be described. FIG. 1 is a plan view of an IC card in this embodiment; FIG. 2 is a sectional view taken along the line A-B-C-D in FIG. 1; and FIG. 3 is an enlarged sectional view of a main part in FIG. 2.

As shown in FIG. 1, an IC card 100 is constituted by a film 10, an electric conductor pattern 20 formed on the film 10, and an electronic component 30 such as an IC chip, or the like, connected to the electric conductor pattern 20 through a connection terminal 32. A part of the electric conductor pattern 20 forms a loop-like antenna coil 22. The antenna coil 22 is connected to the electronic component 30 by the electric conductor pattern. In this embodiment, the number of turns in the antenna coil 22 is selected to be 1. Further, the electronic component 30 and the film 10 are fixed to each other by a temporary fixing material 40.

The IC card 100 has a width D1, for example, of 54 mm and a length L1, for example, of 85.6 mm. That is, the IC card 100 has a size equal to the size of a credit card or a telephone card. The electronic component 30, which has a square shape with a width D2, for example, of 3 mm, is used. The antenna coil 22 has a width D3, for example, of 0.2 mm and the electric conductor pattern 20 has a width D4, for example, of 0.2 mm. The connection terminal 32 is shaped like a 0.15 mm square. Although FIG. 1 is shown, for convenience sake, as if the width of the connection terminal 32 is larger than the width of the electric conductor pattern 20, the width of the connection terminal 32 is actually smaller than the width of the electric conduction pattern 20.

Referring now to FIG. 2, the sectional configuration of the IC card according to this embodiment will be described. Incidentally, parts identical to those in each of FIGS. 1 and 2 are referenced correspondingly.

The electric conductor pattern 20 and the antenna coil 22 are formed by printing on the film 10 of the IC card 100. The electronic component 30 such as an IC chip, or the like, is fixed onto the film 10 by the temporary fixing material 40. The connection terminal 32 of the electronic component 30 is directly bonded to the electric conductor pattern 20 so as to be electrically connected to the electric conductor pattern 20. The cover film 60 is laminated onto the film 10 so as to be fixed to the film 10 by paste 50 such as a hot melt, or the like. The electric conductor pattern 20 and the electronic component 30 are fixed between the film 10 and the cover film 60. Print surfaces 70 and 72 are formed by printing on the film 10 and the cover film 60 respectively.

Further, as shown in enlargement in FIG. 3, the electronic component 30 is fixed onto the film 10 by the temporary fixing material 40 and the connection terminal 32 of the electronic component 30 is directly bonded to the electric conductor pattern 20 so as to be electrically connected to the electric conductor pattern 20. Further, the electronic component 30 is held and fixed between the film 10 and the cover film 60 laminated by paste 50. Incidentally, a portion of the antenna coil 22 is not shown in FIG. 3.

According to this embodiment, the thickness H of the IC card 100 is set to be thin, 0.25 mm.

The structural characteristic of the IC card according to this embodiment is as follows. That is, the electric conductor pattern of the IC card is formed of Ag paste so that the electric conductor pattern has a single layer structure formed only on one surface of a film. In the conventional method, electric conductor patterns (especially, antenna coils) are formed on opposite surfaces of a film. On the other hand, in the present invention, the screen printing step for forming an electric conductor pattern on the other surface of the film and the drying step required after the screen printing step can be eliminated, so that the number of producing steps can be reduced. Further, when the IC card is configured to have a single layer structure, the thickness of the IC card can be set to be thin, 0.25 mm.

Figure 4:
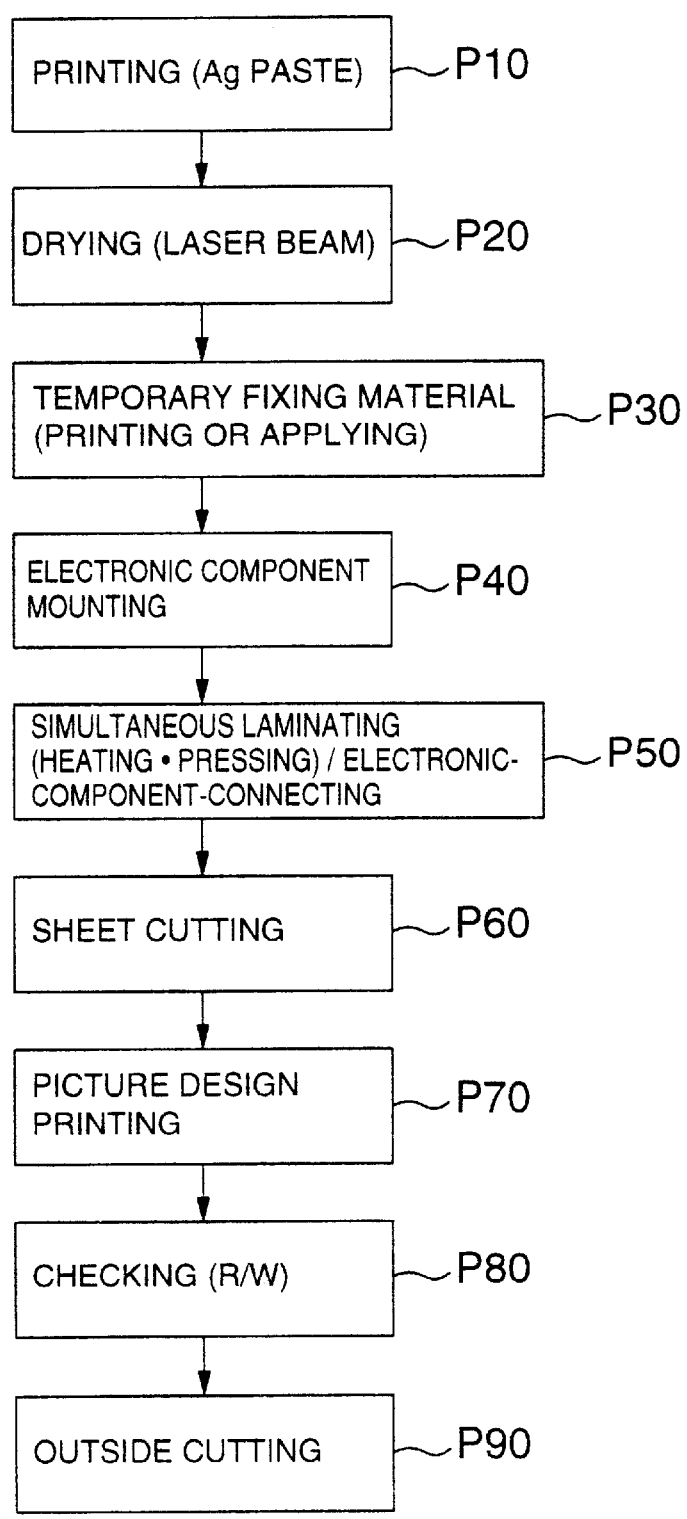
FIG. 4 is a flow chart showing a process for producing the IC card which is a thin electronic circuit component according to the embodiment of the present invention.

The process for producing IC cards which are thin electronic circuit components according to this embodiment will be described below with reference to FIG. 4. Details of the respective producing steps will be described later with reference to FIGS. 5 through 15.

The process for-producing IC cards according to this embodiment comprises an electric conductor pattern forming step including Ag paste printing in a process P10 and laser drying in a process P20; an electronic component mounting step including printing or applying a temporary fixing material in a process P30 and mounting electronic components in a process P40; a laminating step including simultaneously performing lamination through heating and pressing and connection of the electronic components in a process P50; and an outline cutting step including performing sheet cutting in a process P60, double-side picture printing in a process P70, read/write (R/W) check in a process P80 and outside cutting in a process P90.

The contents of the respective processes will be described below in detail with reference to FIGS. 5 through 15.

The Ag paste printing in the process P10 is a part of a process for forming electric conductor patterns 20 on a film 10 as shown in FIG. 2.

Figure 5:
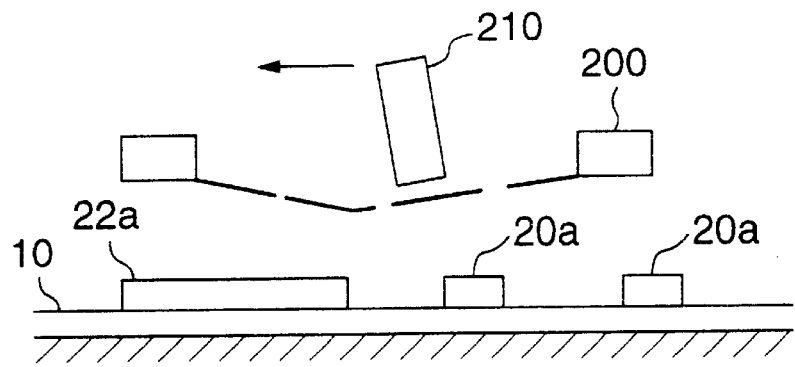
FIG. 5 is a model view for explaining the Ag paste printing step contained in the process of producing the IC card which is a thin electronic circuit component according to the embodiment of the present invention.

That is, as shown in FIG. 5, electric conductor pastes 20a and 22a are formed by printing on a film 10. A screen plate 200 having an aperture portion provided in accordance with the shape of electronic circuit wiring patterns is used for this printing so that the electric conductor pastes 20a and 22a are formed by printing so as to be shaped into a wiring pattern and an antenna coil, respectively, in an electronic circuit by a squeegee 210.

For example, transparent or white polyethylene terephthalate (PET) having a thickness, for example, in a range of from 75 $\mu$m to 100 $\mu$m is used as the material for the film 10. The film 10 is supplied, as a roll film, to the IC card producing apparatus. The film 10 used here has a width, for example, of 250 mm. Although this embodiment has been described about the case where Ag paste is used as each of the electric conductor pastes 20a and 22a to be formed by printing, electrically conductive paste such as Cu paste, or the like, other than the Ag paste, may be used as each of the electric conductor pastes 20a and 22a. Besides PET, plastic material such as polyvinyl chloride (PVC), polyimide, or the like, may be used as the material for the film 10.

Figure 6:
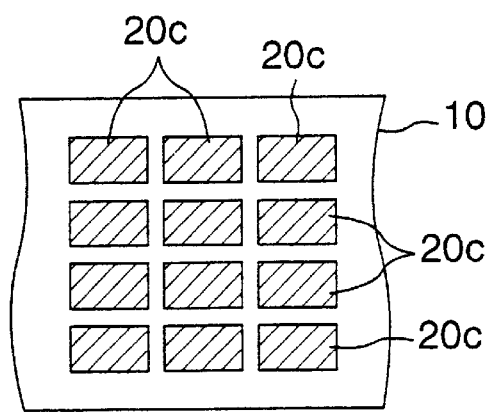
FIG. 6 is a model view for explaining simultaneous printing of a plurality of IC cards in an Ag paste printing step contained in the process of producing IC cards which are thin electronic circuit components according to the embodiment of the present invention.

As shown in FIG. 6, card printing portions 20c for a plurality of IC cards (that is, one-card's electric conductor patterns each formed of electric conductor pastes 20a and 22a) are printed simultaneously by one printing operation by using the screen plate 200. "One printing operation" means a process in which: the squeegee 210 is moved once or several times to form electric conductor pastes 20a and 22a while the screen plate 200 is fixedly placed on the film 10 and electric conductor paste is supplied; and the screen plate 200 is then moved to the next printing position. In the embodiment shown in FIG. 5, four card printing portions 20c are formed in a direction of the width of the film 10 and three card printing portions 20c are formed in a direction of the movement of the squeegee (in a direction of the length of the film 10), so that twelve card printing portions 20c in total are formed simultaneously by one printing operation.

Electric conductor pastes 20a and 22a corresponding to one card are printed in each of the card printing portions 20c.

Figure 7:
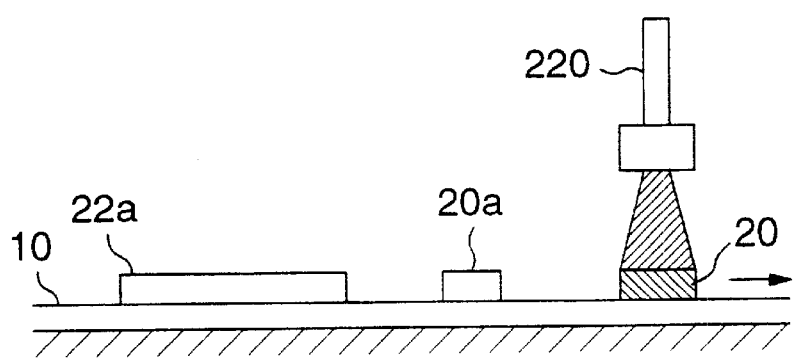
FIG. 7 is a model view for explaining a laser drying step contained in the process of producing IC cards which are thin electronic circuit components according to the embodiment of the present invention.

The laser drying in the process P20 will be described below with reference to FIG. 7.

In the laser printing in this embodiment, a laser beam emitted from a non-contact processing source (for example, a laser light source 220) is radiated onto the electric conductor pastes 20a and 22a printed by the process shown in FIG. 5 so that the laser beam is linear and even in a direction of the width of the film. As a result, the medium of the electric conductor pastes 20a and 22a is vaporized or thermally hardened instantaneously so as to be dried. Accordingly, when electric conductor paste passes under the laser light source at the film-carrying speed, drying is completed. The resistance value of the resin in the electric conductor paste is reduced because of solidification of the resin, so that electric conductor patterns 20 and antenna coils 22 are formed.

A laser wavelength capable of penetrating the film 10 or being reflected by the film 10 but capable of being absorbed to the electric conductor paste is used as the laser wavelength to be selected in this occasion. The PET transparent film has an absorption band of 9 to 10 $\mu$m wavelength and has a tendency to transmit light having a wavelength of 1 $\mu$m. Further, at room temperature, Ag paste absorbs 5 to 10% of light having a wavelength of 1.06 $\mu$m and, in the case where the Ag paste is in a liquid phase, the absorption factor further increases. Accordingly, a YAG laser having a wavelength of 1.06 $\mu$m is used as the laser light source 220.

By using the YAG laser, only Ag paste which has absorbed the laser beam is heated selectively so that the film 10 which transmits or reflects the laser beam is not heated. Accordingly, there is no problem with the shrinkage of the film 10 caused by heat. On the other hand, in the conventional method using a heating furnace with far-infrared radiation, not only Ag paste but also the film per se was heated to thereby bring a problem that the film per se was shrunk. Therefore, an annealing processing for heating the film in a heating furnace was carried out as pre-processing of the printing step shown in FIG. 5 so that the film was shrunk before the printing step. According to the present invention, however, no drying step for the annealing processing is required.

Further, when a $CO_2$ laser (wavelength: 10.6 $\mu$m) is used in the present invention, PET is also heated because the wavelength of the $CO_2$ laser of 10.6 $\mu$m is a wavelength absorbed both to PET as the material for the film 10 and to Ag in the electric conductor paste. However, because the electric conductor paste can be heated while the whole of PET is heated when the output value of the $CO_2$ laser is selected, there arises an advantage that not only drying can be made in the same manner as in the prior art but also the drying speed is high.

Further, the electric conductor paste may be heated and dried by electromagnetic energy instead of laser radiation or the electric conductor paste may be heated and dried by linear scanning of a non-contact energy beam such as an electron beam, or the like.

By using the aforementioned laser, electromagnetic energy, electron beam, or the like, drying equivalent to drying in a far-infrared furnace at 150° C. for 5 minutes can be made in a short time (not longer than 1 minute).

Although this embodiment has been described upon the case where the electric conductor pastes 20a and 22a are dried to form electric conductor patterns and antenna coils, IC cards can be also produced by the following steps P30 to P90 in the case where a roll film having patterns of an aluminum or copper material formed on the film 10 in advance by a method such as an etching method, a metal pattern precipitation method, a metal winding coil method, or the like.

Figure 8:
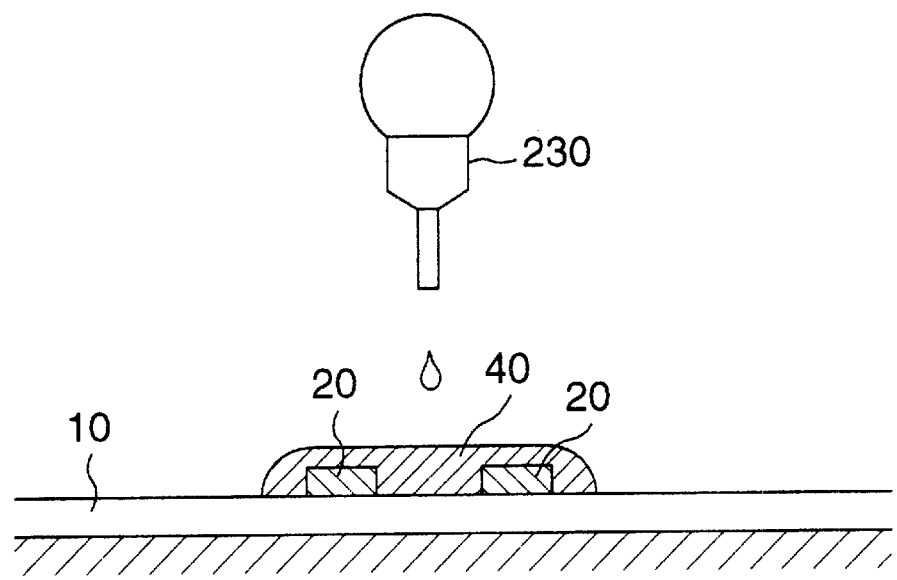
FIG. 8 is a model view for explaining a temporary fixing material printing or applying step contained in the process of producing IC cards which are thin electronic circuit components according to the embodiment of the present invention.

Printing or application of the temporary fixing material in the step P30 will be described below with reference to FIG. 8. In FIG. 8 et seq., the producing process will be described while the antenna coil portion is not shown.

As shown in FIG. 8, a dispenser 230 is used for printing or applying the temporary fixing material 40 to a position which is on the film 10 and in which an electronic component is mounted in the electronic component mounting step in the process P40 which will be described later. A thermoplastic hot melt, or thermoplastic resin, capable of being softened, for example, at a temperature of 100 to 130° C. is used as the material for the temporary fixing material. Another material such as a UV-curing resin, or the like, other than the thermoplastic hot melt can be used as the temporary fixing material 40. The temporary fixing material 40 is applied (printed) so that the application area of the temporary fixing material 40 is equal to or slightly larger than the electronic component size (for example, the area of 3×3 mm).

The thermoplastic material used as the temporary fixing material 40 may be replaced by a material which is liquid at ordinary temperature and high in viscosity. This is because the electronic component (for example, having a thickness of 50 μm) to be mounted in the electronic component mounting step is required to be temporarily fixed by a tackiness to avoid positional displacement also in the case where the electronic component is carried to the lamination in the process P50.

The electronic component mounting in the process P40 will be described below with reference to FIG. 9.

Figure 9:
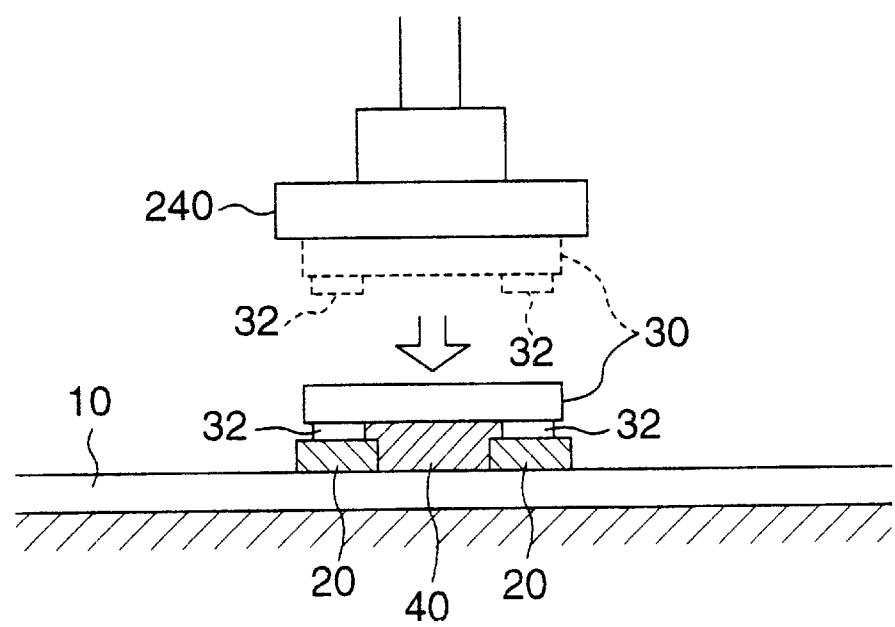
FIG. 9 is a model view for explaining an electronic component mounting step contained in the process of producing IC cards which are thin electronic circuit components according to the embodiment of the present invention.

As shown in FIG. 9, an electronic component 30 such as an IC bare chip, or the like, is carried while it is attracted to an end of a bare chip mounter nozzle 240, so that the electronic component 30 is positioned on the electric conductor pattern 20. In this occasion, the electronic component 30 is mounted on the electric conductor pattern 20 so that terminals 32 of the electronic component 30 are located on predetermined terminal portions of the electric conductor pattern 20. Because the temporary fixing material 40 is applied onto the film 10 in the process P30, the electronic component 30 is fixed onto the film 10 by the temporary fixing material 40. The connection terminals 32 of the electronic component 30 are formed by a metal wire ball bonding method or a gold-plating bump method in advance. A protection electrically insulating processing for electrically insulating the wiring pattern of the bare chip by polyimide (PIQ) to protect the wiring pattern is applied to the rear surface of the electronic component 30, that is, to a surface on which the connection terminals 32 are to be formed, except portions in which the connection terminals 32 are to be formed. By the heating and pressing step which will be described later, the connection terminals 32 are inserted in the electric conductor pattern 20 formed of Ag paste, so that electrical connection can be obtained. The quantity of protrusion of the terminals 32 is selected to be, for example, from 5 to 50 μm.

Because the temporary fixing material 40 is applied onto an area slightly larger than the size of the electronic component 30 as described above with reference to FIG. 8, the whole rear surface of the electronic component 30 is fixed onto the film 10 and the electric conductor pattern 20.

Further, the connection terminals 32 are also connected and fixed to the electric conductor pattern 20. Accordingly, the fixing area of the electronic component 30 is set to be large, 9 mm$^2$ (the whole surface of a 3 mm square). In the conventional method, the fixing area is 0.4 mm$^2$ (two 0.2 mm squares) because the electronic component 30 is fixed only by the connection terminals 32, and connection strength is weak because whole mechanical stress is received only by the terminal portion. On the other hand, in this embodiment, the fixing area is widened so that adhesive strength increases to be 20 times or more in simple comparison.

Simultaneous lamination and connection of electronic components by use of the heating and pressing in the process P50 will be described below with reference to FIGS. 10 and 11.

Figure 10:
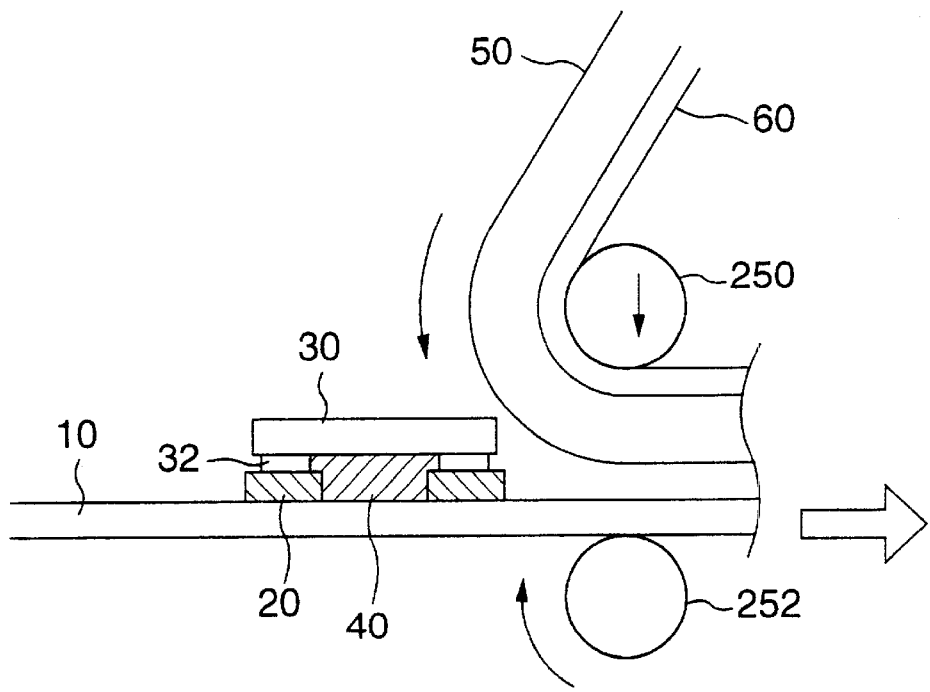
FIG. 10 is a model view for explaining a lamination step contained in the process of producing IC cards which are thin electronic circuit components according to the embodiment of the present invention.
Figure 11:
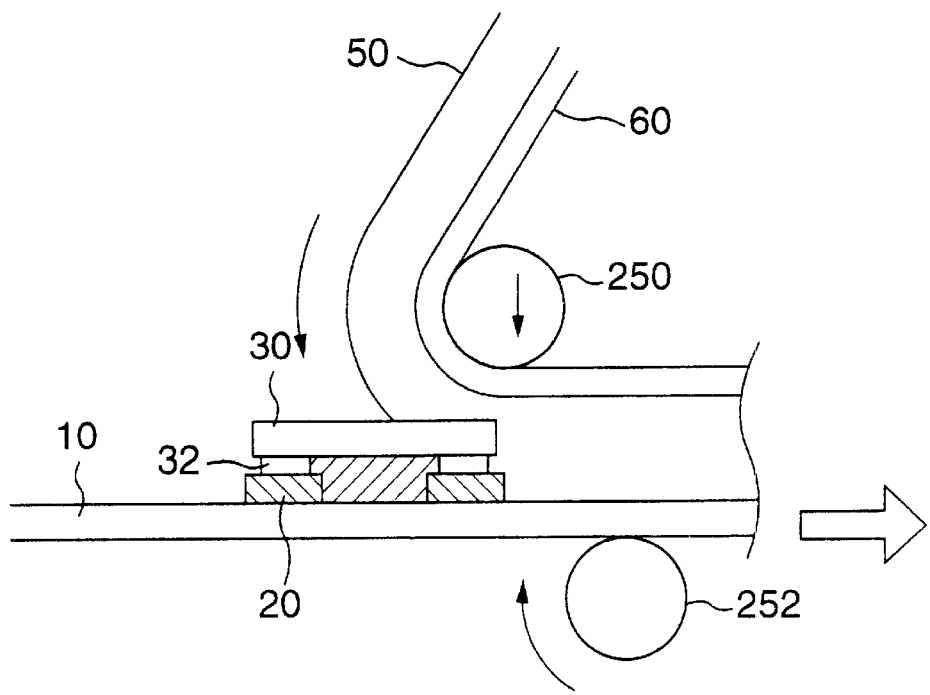
FIG. 11 is a model view for explaining a simultaneous lamination and electronic-component connection step contained in the process of producing IC cards which are thin electronic circuit components according to the embodiment of the present invention.

In FIG. 10, the cover film 60 used is formed from the same material as that for the film 10 and has the same thickness as that of the film 10. That is, the cover film 60 used is formed from transparent or white PET and has a thickness of 75 to 100 μm. A surface of the cover film 60 is coated with paste 50 in advance. Here, a hot melt is used as the material for the paste 50. The thickness of the paste 50 is set to be, for example, 80 μm. Incidentally, another adhesive agent than the hot melt may be used as the material for the paste 50.

The film 10 having the electronic component 30 mounted thereon and the cover film 60 coated with paste 50 are put between hot rolls 250 and 252 and laminated by the hot rolls 250 and 252. A steel roll is used as each of the hot rolls 250 and 252. Because paste is pressed while roll deformation is prevented, flattening of the card produced is performed simultaneously with the lamination.

At the same time, the terminals 32 of the electronic component 30 are connected to the electric conductor pattern 20 as shown in FIG. 10. Assuming now that the laminating pressure and heating energy are selected to be, for example, 20 kgf/cm$^2$ and 130° C. respectively, then lamination of the film 10 and the cover film 60 and connection of the terminals 32 of the electronic component 30 and the electric conductor pattern 20 are performed simultaneously.

When a temporary fixing material such as a hot melt is used as an adhesive agent for fixing the electronic component, there arise advantages that the material cost is reduced, the time required for connection of the electronic component is shortened, high accuracy is not required in mounting the electronic component, etc., for example, compared with the case where an anisotropic electrically conductive adhesive agent is used.

The material cost of the anisotropic electrically conductive adhesive agent is about 10 times as much as that of the hot melt agent or tackiness agent. Further, the time required for heating/pressing the hot melt agent is about 2 seconds per chip whereas the time required for heating/pressing the anisotropic electrically conductive adhesive agent is generally about 10 times as much as the time required for heating/pressing the hot melt agent. Further, with respect to the accuracy in mounting of chips, parallelism/squareness in alignment of chips and patterns is required at the time of mounting of chips because the particle size of electrically conductive particles contained in the anisotropic electrically conductive adhesive agent is of the order of μm. That is, taking displacement of grasping/gripping of electrically conductive particles into account, apparatus accuracy of the order of μm is required. On the contrary, in a system using a hot melt, or the like, the general accuracy (about ±50 μm) of a general-use mounter can be used sufficiently because electrically conductive particles are not used as a medium. Accordingly, reduction of the equipmental cost, reduction of the process management cost and increase of speed can be achieved.

Incidentally, flat pressing may be used as another method than the hot roll method for performing lamination. In such the flat pressing, lamination and junction may be performed in vacuum by heating lamination. In such the flat pressing, voids are not caused within adhesive materials attatched to an under surface of the chip so that junction quality can be improved. Further, lamination can be performed without causing voids within adhesive materials outside the chip.

When lamination with no roll deformation and connection of electronic components are performed simultaneously as described in this embodiment, the protrusion (corresponding to the chip thickness') of electronic component mounting portions, which becomes a problem after lamination when the lamination is performed after the electronic component connecting step as in the prior art, can be reduced so as to be substantially flat (to be not larger than 20 μm). Accordingly, the flattening step after lamination becomes unnecessary. Incidentally, in the case where the quantity of protrusion after lamination is large, the flattening step may be performed after lamination as occasion demands.

In the conventional method, a step for connecting electronic components to electric conductor patterns while drying and a lamination step, that is, two steps are required. On the contrary, in this embodiment, simultaneous lamination and connection of electronic components can be performed by one step in the process P50. Accordingly, the length of the production line can be shortened.

In the case where the electric conductor pattern 20 is formed by etching or from wire, for example, an Si/Bi-group low-melting solder (melting point: 100 to 150° C.) layer or a low-melting In alloy layer is formed on the electric conductor pattern 20 in advance. On the other hand, the connection terminals 32 formed by a gold wire ball bonding method or a gold-plating bump method can be connected to the electric conductor pattern 20 by the heating/pressing step.

Figure 12:
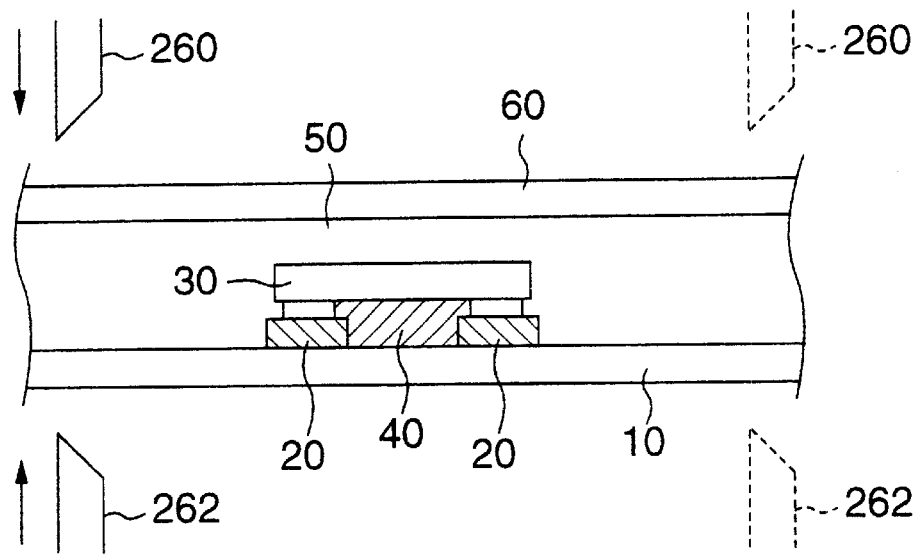
FIG. 12 is a model view for explaining a sheet cutting step contained in the process of producing IC cards which are thin electronic circuit components according to the embodiment of the present invention.

The sheet cutting in the process P60 will be described below with reference to FIG. 12.

In the sheet cutting step, the laminated sheet is cut into a predetermined size by sheet cutters 260 and 262. The size to be subjected to cutting is, for example, 250 mm×300 mm because twelve IC cards as explained in FIG. 6 are used as one unit so that four IC cards are arranged in the widthwise direction of the film and three IC cards are arranged in the longitudinal direction of the film.

Figure 13:
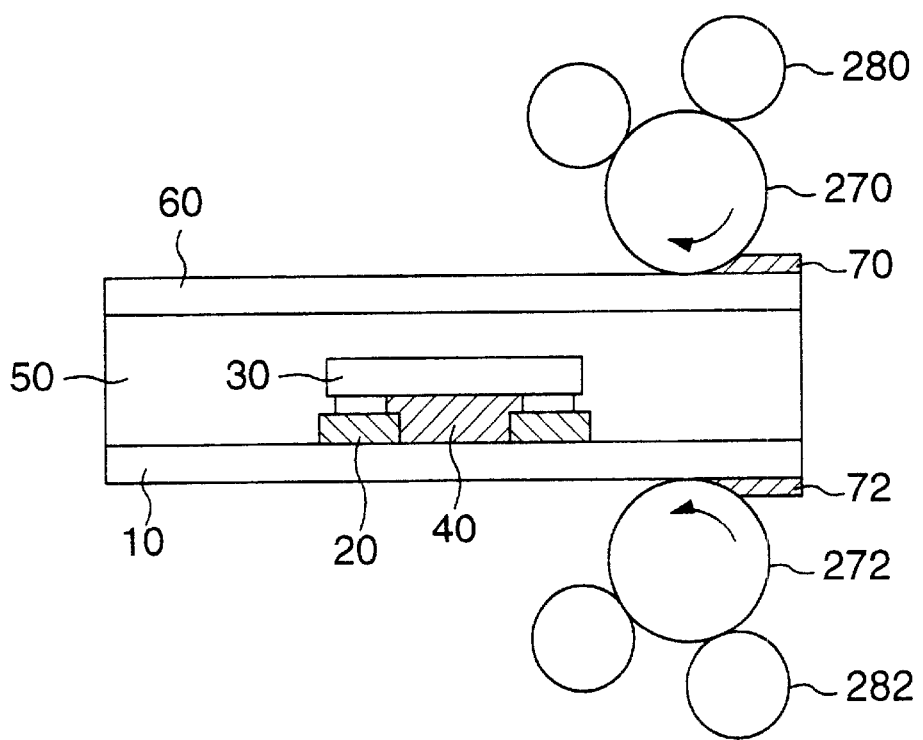
FIG. 13 is a model view for explaining a picture-design printing step contained in the process of producing IC cards which are thin electronic circuit components according to the embodiment of the present invention.

The double-side picture printing in the process P70 will be described below with reference to FIG. 13.

Two kinds of ink 280 and 282 deposited on design picture drums in a size of a matrix having four lines and three rows are transferred to bracket drums 270 and 272 respectively and further design picture printing surfaces 70 and 72 are offset-printed on the surface of the film 10 and the surface of the cover film 60 from the bracket drums 270 and 272 respectively.

Incidentally, with respect to the printing surfaces 70 and 72, pictures may be printed on outer surfaces of the film 10 and the cover film 60 respectively in advance.

Figure 14:
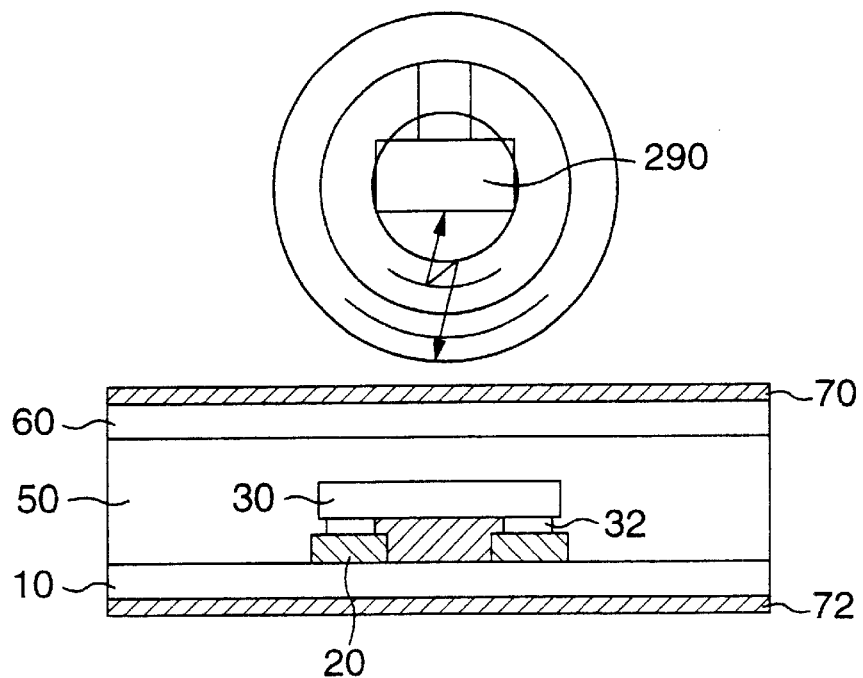
FIG. 14 is a model view for explaining a read/write check step contained in the process of producing IC cards which are thin electronic circuit components according to the embodiment of the present invention.

The read/write (R/W) check in the process P80 will be described below with reference to FIG. 14.

In the checking step, data are written into the electronic component 30 by radio or the written data are read from the electronic component 30 by radio so that checking is performed by a communication checker 290. Checking may be performed for all twelve electronic components in one sheet or may be performed for a predetermined number of electronic components sampled.

The outside cutting in the process P90 will be described below with reference to FIG. 15.

As described above, a number of IC cards, for example, twelve IC cards, are contained in one sheet. Accordingly, in the outside cutting step, the outside is processed to an electronic component size, for example, equal to the size of a visiting card by use of a press mold 300. Then, the electronic components are packaged and shipped.

Figure 15:
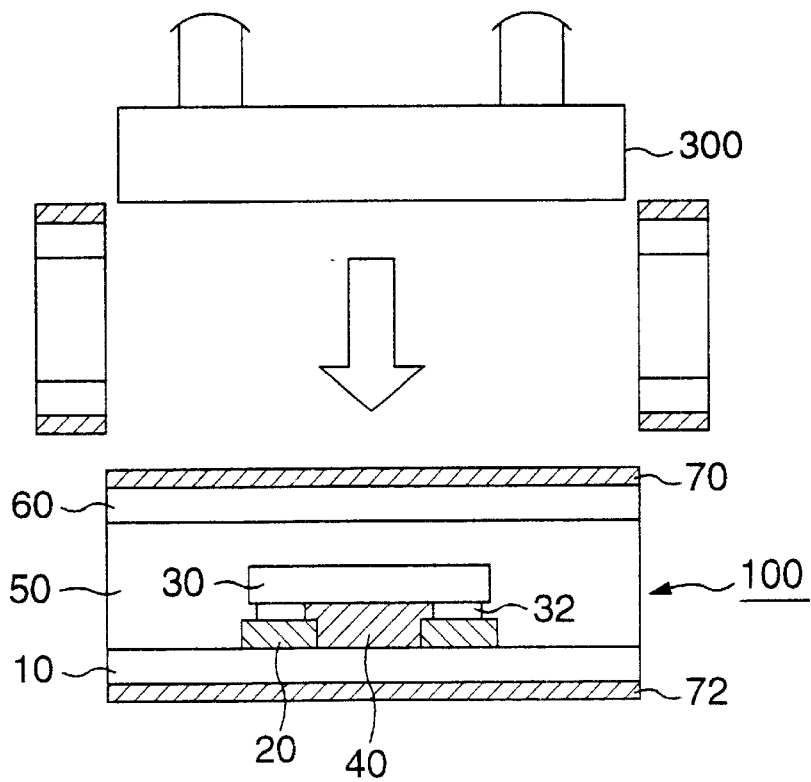
FIG. 15 is a model view for explaining an outside cutting step contained in the process of producing IC cards which are thin electronic circuit components according to the embodiment of the present invention.

In this embodiment, when the thickness of each of the film 10 and the cover film 60 is selected to be from 75 μm to 100 μm, the thickness of the paste 50 is selected to be 80 μm and the thickness of each of the electronic components 30 is selected to be 50 μm, the thickness of the IC card which is one of electronic circuit components completed by the outside cutting step shown in FIG. 15 is 0.25 mm. Accordingly, the size of IC card can be reduced. On the contrary, in the conventional method, even in the case where the thickness of each of the film and the cover film is selected to be 50 μm, the thickness of the lower paste is selected to be 20 μm, the thickness of the upper paste is selected to be 80 μm, the thickness of each of the electronic components is selected to be 50 μm, the thickness of the largest portion of the IC card is 0.3 mm and the thickness of the other portion of the IC card is 0.25 mm. Accordingly, in this embodiment, the size of the IC card can be reduced more extremely than that of the conventional IC card.

Figure 16:
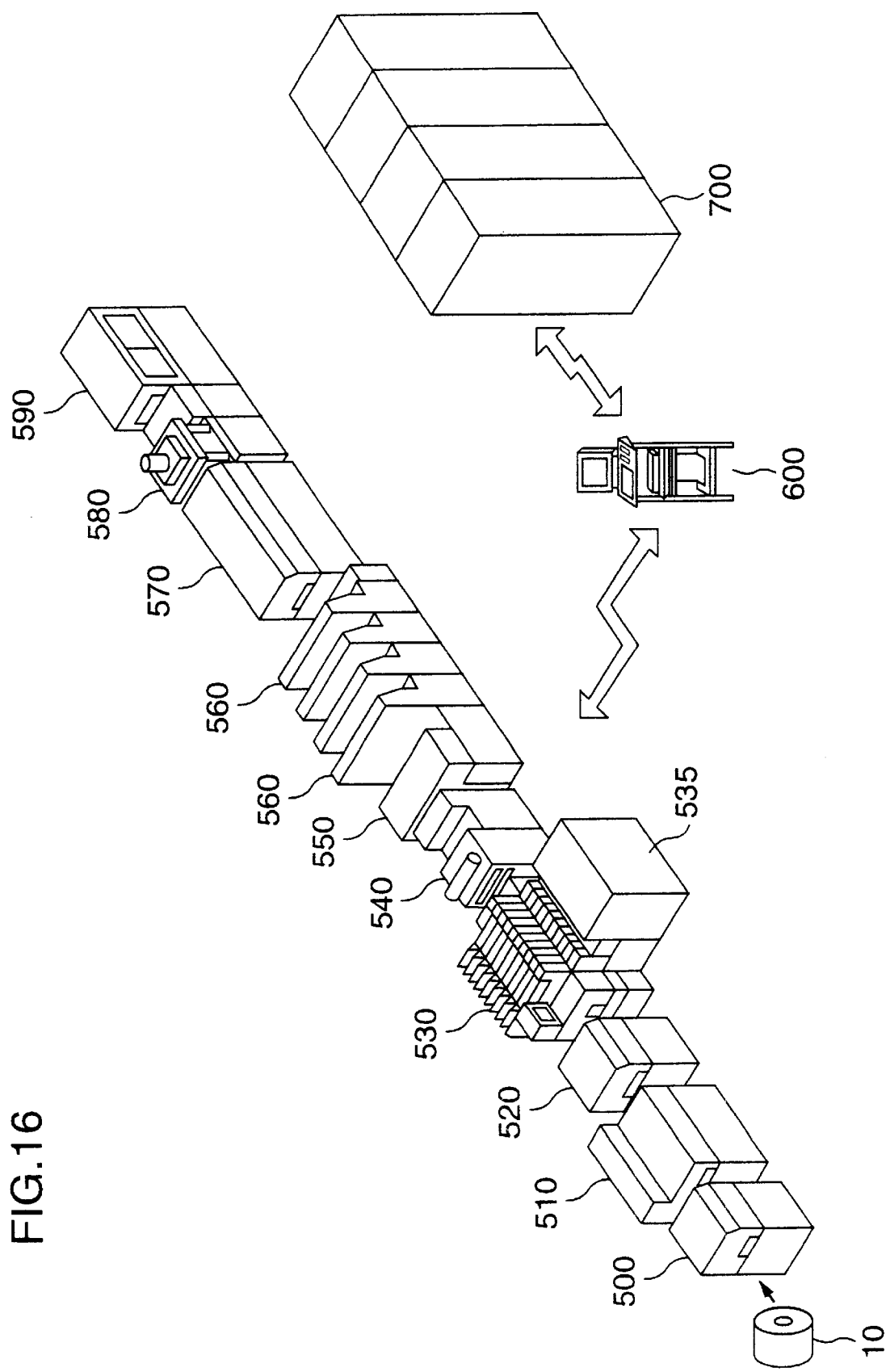
FIG. 16 is a perspective view showing the overall configuration of an apparatus for producing IC cards which are thin electronic circuit components according to the embodiment of the present invention.

The overall configuration of a producing apparatus using an integrated roll-to-roll method for producing IC cards which are electronic circuit components according to this embodiment will be described below with reference to FIG. 16.

A roll-like PET film 10 is supplied to a screen printer 500 for printing Ag paste in the process P10. The film on which Ag paste is printed is dried by a laser drier 510 in the process P20. Then, a temporary fixing material is printed or applied by a quantitative coater 520 in the process P30. Then, electronic components are mounted on the temporary fixing material by a bare chip mounter 530 in the process P40. Bare chips are supplied to the bare chip mounter 530 by a one-chip separator/supplier 535. A laminator 540 performs both simultaneous lamination and connection of electronic components by the heating/pressing in the process P50. After lamination, the resulting sheet is cut by a sheet cutter 550 in the process P60. Further, pictures are printed on double sides by a printer 560 in the process P70. Then, read/write (R/W) check is performed by a communication checker 570 in the process P80. A die-cutter 580 performs the outside cutting in the process P90. Finally, IC cards which are finished products are packaged by a packager 590.

An equipment centralized control computer 600 controls the operations of respective producing machines 500, . . . , 590. Information concerning design, the number of products to be produced, etc. is inputted into a host computer 700. The equipment centralized control computer 600 controls the operations of the respective producing machines 500, . . . , 590 on the basis of the information stored in the host computer 700 to thereby control the automatic production of IC cards.

As described above, in this embodiment, drying is performed by one step of a process 200. On the contrary, in the conventional method, three drying steps are required. That is, in the conventional method, there are required a first drying step after the formation of electric conductor patterns on a front surface of the film, a second drying step after the formation of electric conductor patterns on a rear surface of the film and a third drying step for connecting electronic components to the electric conductor patterns after mounting of the electronic components on the electric conductor patterns. On the contrary, in this embodiment, drying can be performed by one step, so that the furnace length of a drying furnace can be reduced to one third because of reduction of the number of steps.

Further, in the conventional drying method using a far-infrared lamp for performing drying, the furnace length of the drying furnace is required to be 15 m per step. Incidentally, the drying conditions used in this occasion are a drying temperature of from 120 to 150° C. and a drying time of from 3 to 5 minutes. On the contrary, when laser drying is used as shown in this embodiment, the furnace length of the drying furnace can be reduced to 5 m. Incidentally, the tact for drying is set to be 2 seconds.

Accordingly, the total furnace length of the drying furnace required for the three drying steps in the conventional method is 45 m whereas the total furnace length of the drying furnace in this embodiment can be reduced to 5 m because drying is performed by one laser drying step. Accordingly, the area of the production floor required for arranging production equipment for the drying step can be reduced to one ninth. Further, when far-infrared heating using far-infrared heating furnaces in three steps is replaced by laser heating in one step, the electric power consumed can be reduced to about one seventh.

Further, in this embodiment, lamination and connection of electronic components are performed simultaneously, so that the length of the production line can be shortened compared with the conventional method in which a step for connecting electronic components and a lamination step are provided separately from each other.

Accordingly, the length (about 100 m) of the production line in the conventional method can be shortened to 25 m owing to the reduction in the drying step and the step of simultaneous lamination/electronic-component connection, so that the area of the production floor can be reduced to about one fourth in terms of space saving.

Further, in the formation of electric conductor patterns from Ag paste in each of IC cards, only one surface of the film is provided as a single layer structure. In the conventional method, electric conductor patterns, especially, antenna coils are formed on opposite surfaces of the film. On the contrary, in this embodiment, the screen printing step for forming electric conductor patterns on the other surface and the drying step after the screen printing step can be eliminated, so that the number of producing steps can be reduced.

Further, by providing the IC card as a single layer structure, the thickness of the IC card can be reduced to 0.25 mm.

Figure 17:
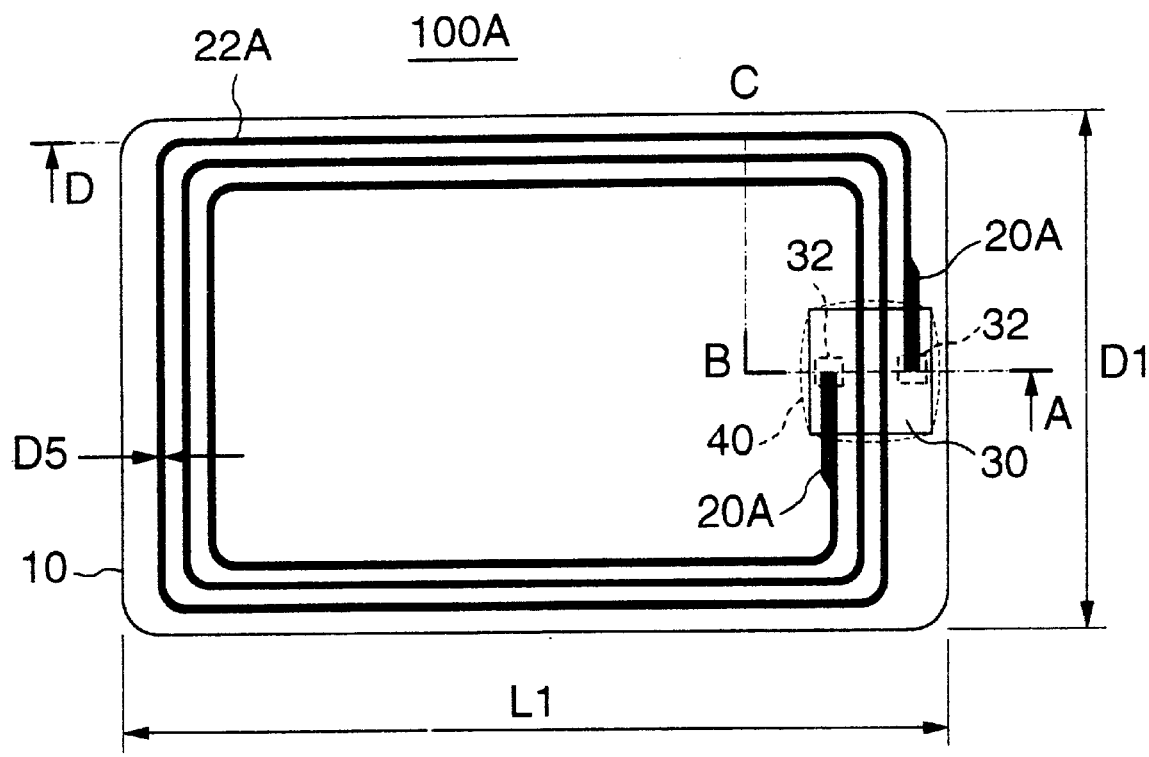
FIG. 17 is a plan view of an IC card which is a thin electronic circuit component according to another embodiment of the present invention.
Figure 18:
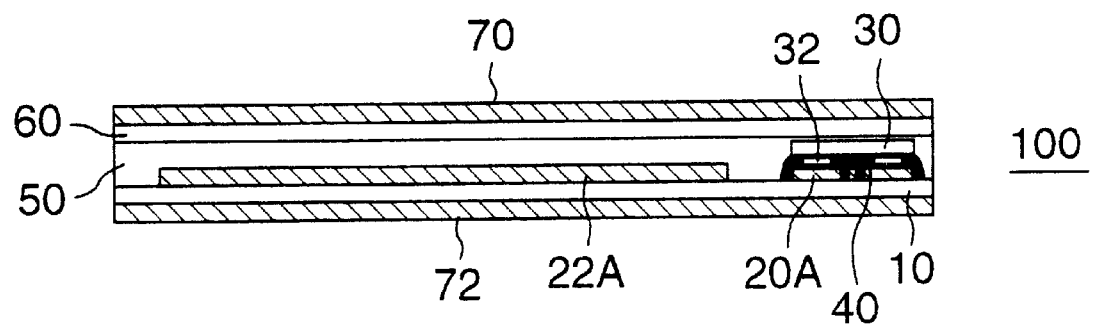
FIG. 18 is a sectional view taken along the line A-B-C-D in FIG. 17, showing a section of an IC card which is a thin electronic circuit component according to the other embodiment of the present invention.

The configuration of an IC card according to another embodiment of the present invention will be described below with reference to FIGS. 17 and 18. FIG. 17 is a plan view of an IC card according to this embodiment; and FIG. 18 is a sectional view taken along the line A-B-C-D in FIG. 17. Incidentally, in FIGS. 17 and 18, parts the same as those in FIGS. 1 and 2 are referenced correspondingly.

As shown in FIG. 17, the IC card 100A comprises a film 10, an electric conductor pattern 20A formed on the film 10, and an electronic component 30 such as an IC chip, or the like, connected to the electric conductor pattern 20A through connection terminals 32. A part of the electric conductor pattern 20A forms a loop-like antenna coil 22A. The antenna coil 22A is connected to the electronic component 30 by the electric conductor pattern 20A. In this embodiment, the number of turns in the antenna coil 22A is set to be 3. The antenna coil 22A has a width D5, for example, of 0.07 mm. Further, the electronic component 30 and the film 10 are fixed to a temporary fixing material 40.

The antenna coil 22A is arranged so that starting and ending points of the antenna coil pattern meet just two electric terminals 32 respectively. That is, the antenna coil 22A is arranged so that no return wire is provided in the antenna coil.

The sectional configuration of the IC card according to this embodiment will be described below with reference to FIG. 18. Incidentally, in FIG. 18, parts the same as those in FIG. 17 are referenced correspondingly.

An electric conductor pattern 20A and an antenna coil 22A are printed on a film 10 in the IC card 100A. An electronic component 30 such as an IC chip, or the like, is fixed onto the film 10 by a temporary fixing material 40. Connection terminals 32 of the electronic component 30 are directly bonded to the electric conductor pattern 20A so as to be electrically connected to the electric conductor pattern 20A. A cover film 60 is laminated and fixed onto the film 10 through paste 50 such as a hot melt, or the like. The electric conductor pattern 20A and the electronic component 30 are fixed between the film 10 and the cover film 60. Printing surfaces 70 and 72 are printed on the film 10 and the cover film 60 respectively.

As described above, according to the present invention, electronic circuit components can be produced while the number of producing steps is reduced.

Further, according to the present invention, the length of the production line for producing thin electronic circuit components can be shortened, so that the area of the production floor can be narrowed.

What is claimed is:

1. An apparatus for producing electronic circuit components, comprising:
    an electric conductor pattern forming means for forming electric conductor patterns on one surface of a first film by drying electric conductor paste coated on said one surface of said first film to thereby form predetermined patterns;
    a component mounting means for mounting electronic components, through a fixing agent, onto said electric conductor patterns formed on said one surface of said first film;
    a laminating means for laminating a second film on said first film while connecting said electronic components to said electric conductor patterns;
    wherein said electric conductor pattern forming means includes:
        a printing means for printing electric conductor paste on said first film;
        a drying means for radiating a non-contact energy beam onto said printed electric conductor paste to thereby dry or thermally harden said printed electric conductor paste;
        wherein said drying means performs radiation of a non-contact energy beam onto the printed electric conductor paste so as to collectively dry or thermally harden said electric conductor paste which forms electric conductor patterns for a plurality of sheets of electronic circuit components arranged in a direction perpendicular to a direction of scanning of said non-contact energy beam; and wherein said non-contact energy beam has a wavelength that exhibits a larger absorption factor in said paste than in said first film and either transmits through or is reflected by said first film.

2. An apparatus for producing electronic circuit components according to claim 1, wherein:

said printing means performs printing of electric conductor paste on said first film by using a screen, said screen being provided with aperture portions so that electric conductor patterns for a plurality of sheets of thin electronic circuit components are formed by one screen printing operation by applying the electric conductor paste onto said first film through said screen.

3. An apparatus for producing electronic circuit components according to claim 1, wherein said component mounting means includes:

a dispenser for supplying a fixing material onto said electric conductor patterns formed on said single surface of said first film; and means for arranging and mounting said electronic components on said first film.

4. An apparatus for producing film electronic circuit components according to claim 1, wherein said component mounting means includes:

means for applying a selected one of a thermoplastic resin and a UV-curing resin onto an application region; and means for mounting said electronic components on said application region.

5. An apparatus for producing electronic circuit components according to claim 1, wherein said laminating means performs the lamination of said first and second films in a manner so that said first and second films are pressed between two steel hot rolls while said rolls are rotated to prevent roll deformation from occurring in said films.

* * * * *